(12) United States Patent
Jang

(10) Patent No.: US 7,545,692 B2
(45) Date of Patent: Jun. 9, 2009

(54) CIRCUIT AND METHOD OF TESTING A FAIL IN A MEMORY DEVICE

(75) Inventor: Chae Kyu Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 59 days.

(21) Appl. No.: 11/754,028

(22) Filed: May 25, 2007

(65) Prior Publication Data
US 2008/0174297 A1    Jul. 24, 2008

(30) Foreign Application Priority Data
Jan. 23, 2007    (KR) .................. 10-2007-0007053

(51) Int. Cl.
*G11C 7/00* (2006.01)
(52) U.S. Cl. ............. 365/201; 365/185.12; 365/185.09; 365/185.18
(58) Field of Classification Search ............... 365/201, 365/185.12, 185.18, 185.09
See application file for complete search history.

(56) References Cited

U.S. PATENT DOCUMENTS 6,377,507 B1 *    4/2002    Tsao .................. 365/230.03

FOREIGN PATENT DOCUMENTS

| JP | 09-101347 | 4/1997 |
|---|---|---|
| KR | 1020010027544 A | 4/2001 |

* cited by examiner

*Primary Examiner*—Huan Hoang
(74) *Attorney, Agent, or Firm*—Townsend and Townsend and Crew LLP

(57) ABSTRACT

A circuit for testing a fail in a memory device is disclosed. The memory device includes a memory cell array, a page buffer section, a current controller, and a current measuring section. The memory cell array has memory cells coupled to pairs of bit lines and word lines. The page buffer section has page buffers for programming data to a memory cell selected in accordance with each of the pairs of the bit lines or reading data from the memory cell. The current controller has switching sections coupled to each of the page buffers in the page buffer section and for outputting a current passing through the page buffer selected in accordance with control signals. The current measuring section converts values of currents passing through the switching sections of the current controller into digital values, and outputs the digital values.

13 Claims, 5 Drawing Sheets

CIRCUIT AND METHOD OF TESTING A FAIL IN A MEMORY DEVICE

CROSS-REFERENCE TO RELATED APPLICATIONS

This application claims priority from Korean Patent Application No. 2007-7053, filed on Jan. 23, 2007, the contents of which are incorporated herein by reference in its entirety.

BACKGROUND OF THE INVENTION

The present invention relates to a circuit and a method of testing a fail in a memory device. More particularly, the present invention relates to a method of performing a fail test for the whole of a memory device and performing a fail test for each of the bit lines in the memory device.

It is very difficult to manufacture a memory device that is void of defects. Hence, it is impossible to use the memory device in the case that a normal cell as a unit memory element has a fail.

Accordingly, redundancy cell arrays having the same characteristic as a normal cell array are formed in the memory device when the memory device is manufactured.

The above memory device detects whether or not the normal cell array has a fail under a wafer state. Here, in the case that the normal cell array has a fail, the memory device is discarded or a redundancy cell is substituted for a normal cell having a fail.

FIG. 1 is a plan view illustrating a common circuit for testing a fail.

FIG. 1 shows a part of the memory device having a circuit for measuring a current passing through a bit line by using a current mirror, and discriminating whether or not a fail has occurred in the memory device through the measured current.

In FIG. 1, the memory device includes a memory cell array 110 having at least one bit line connected to a plurality of memory cells for storing data, a page buffer section 120 having a plurality of page buffers PBq to PBn for programming or reading data of the memory cell connected to a pair of bit lines included in the memory cell array 110, a current comparing section 130 having comparing circuits iPBq to iPBn for comparing a reference current with a current passing through the page buffers PBq to PBn and outputting the comparison result, a current measuring section 140 for measuring a total current i1 passing through the current comparing section 130 by using the current mirror, and an adjusting section 150 for adjusting a level of a current passing through the current measuring section 140.

A total current passing through the page buffer section 120 and outputted to the current comparing section 130 is the current i1 passing through a third node 3. In addition, the current i1 passing through the third node 3 is identical to a current i2 passing through a fourth node 4 because the current measuring section 140 is made up of the current mirror.

The current mirror section 140 includes a first P-MOS transistor P1, a second P-MOS transistor P2, a first inverter IN1 and a second inverter IN2. Here, the P-MOS transistors P1 and P2 form the current mirror, and so the current i1 is identical to the current i2 which passes through the fourth node 4.

The fourth node 4 is connected to the adjusting section 150.

The adjusting section 150 includes a plurality of current paths operated by control circuits B1 to Bn.

The control circuits B1 to Bn may have transistors for controlling each of current paths. Accordingly, the level of the current passing through the fourth node 4 may be adjusted by the current i2 and the adjusting section 150.

Therefore, a program of a memory cell connected to each of the page buffers PBq to PBn is determined in accordance with an inputted data, and so the current is changed depending on the program. Additionally, the control circuits B1 to Bn of the adjusting section 150 are controlled by using the changed current, and thus the level of the current of the fourth node 4 is adjusted. Further, the first inverter IN1 and the second inverter IN2 change a value of the fourth node 4 as an analog value into a digital value in accordance with the level of the current of the fourth node 4, and then output the digital value.

Hereinafter, a process of operating the circuit for testing a fail of a bit line will be described in detail.

FIG. 2 is a flow chart illustrating a method of testing a fail of a bit line by using the circuit in FIG. 1.

Referring to FIG. 2, in the case that a program command, an address and data to be programmed are inputted to the memory device in steps of S201 to S205, a program pulse is provided in step of S207. As a result, data in the memory cell related to the address are programmed. In this case, the bit lines connected to the programmed memory cell are connected to the page buffers PBq to PBn of the page buffer section 120.

In steps of S209 to S211, when the current i2 is changed in accordance with the current i1 passing through every page buffer PBq to PBn, the fourth node 4 is connected in sequence to the control circuits B1 to Bn, and then the currents passing through the page buffers PBq to PBn are tested, respectively. Subsequently, the number of the bit line to which a fail has occurred is scanned. In the case that the test is passed, it is discriminated whether or not a fail has occurred in the bit line by reading several times the control circuits B1 to Bn.

In steps of S209 to S215, the control circuits B1 to Bn operate in sequence to measure the currents passing through every page buffer PBq to PBn so as to verify whether or not a fail has occurred in the bit lines. Then, the bit lines to which the fail has occurred are verified by scanning.

The process of verifying the fail of the bit line by measuring the current is done by reading several times the control circuits B1 to Bn. Hence, power consumption is great and much time is required for the verification.

In addition, the fail of the bit line is tested by measuring the currents passing through each of the page buffers PBq to PBn. However, a method of performing a fail test for the whole of the memory device does not exist in a conventional art.

Accordingly, a fail test for the whole of the memory device is performed by only testing the fail of every bit line and then scanning the number of the bit lines to which a fail has occurred. Further, the test method would always consume a constant current because the reference voltage is used. In other words, power is always consumed.

SUMMARY OF THE INVENTION

The present invention relates to a circuit and a method of testing a fail in a memory device for reducing the power consumption with verifying whether or not a fail has occurred. Particularly, the circuit and the method perform a fail test for the whole of the memory device, and then perform a fail test for each of the bit lines.

A circuit for testing a fail in a memory device according to one example embodiment of the present invention includes a current controller and a current measuring section. The current controller is coupled to each of page buffers for programming or reading data in a memory cell corresponding to a pair of bit lines, has switching sections for outputting a current passing through the page buffer selected in accordance with control signals provided to each of the page buffers. The current measuring section converts a value of a current passing through the switching sections of the current controller into a digital value, and outputs the digital value.

The current controller includes a plurality of first transistors coupled between the page buffers and a first node. Here, the first transistors are operated in accordance with the control signals.

The current measuring circuit includes second transistors, inverters and a multiplexer MUX. The second transistors are coupled in serial between the first node and a ground voltage, wherein some of the second transistors is operated depending on a clock signal. The inverters are coupled to nodes between the second transistors, convert levels of currents passing through the nodes into digital values and output the digital values. The MUX outputs a signal generated by combining the digital values.

The second transistor coupled to the ground voltage is operated in accordance with an enable signal, thereby controlling an operation of the current measuring section.

The control signals have high levels when a fail test about a whole of the memory device is performed.

A method of testing a fail in a memory device having a memory cell array which includes memory cells coupled to pairs of bit lines and word lines, and page buffers corresponding to each of the pairs of the bit lines according to one example embodiment of the present invention includes performing a program operation or a read operation in the memory cell array; verifying a fail about a whole of the memory device by measuring a total current passing through every page buffers; measuring currents passing through each of the page buffers in case that it is verified that a fail is not occurred to the whole of the memory device, and performing a fail test about each of the bit lines coupled to the page buffers; counting a number of bit lines to which a fail is occurred in accordance with the fail test.

The step of the verifying the fail about the whole of the memory device includes regarding the memory device as a failed device in case that a level of the total current is smaller than a first current level; regarding the memory device as an imaginary failed device in case that the level of the total current has a value between the first current level and a second current level, and performing a fail test about each of the bit lines.

The first current level is a current level set for verifying the fail.

The second current level corresponds to a total current level when no fail is occurred to the memory device.

It is discriminated that the fail is occurred to the memory device in case that a number of bit lines to which the fail is occurred is more than a given value, and wherein the number of the bit lines is obtained in the step of performing the fail test about each of the bit lines in the imaginary failed memory device.

A memory device a memory according to one example embodiment of the present invention include a memory cell array, a page buffer section, a current controller, and a current measuring section. The memory cell array has memory cells coupled to pairs of bit lines and word lines. The page buffer section has page buffers for programming data to a memory cell selected in accordance with each of the pairs of the bit lines or reading data from the memory cell. The current controller has switching sections coupled to each of the page buffers in the page buffer section and for outputting a current passing through the page buffer selected in accordance with control signals. The current measuring section converts values of currents passing through the switching sections of the current controller into digital values, and outputs the digital values.

The current controller includes a plurality of first transistors coupled to the page buffers and a first node. Here, each of the transistors is operated by the control signals.

The current measuring section includes a plurality of second transistors, a plurality of inverters and a multiplexer MUX. The second transistors are coupled in serial between the first node and a ground voltage, wherein some of the second transistors are operated in accordance with a clock signal. The inverters are coupled to nodes between the second transistors, and output the digital values corresponding to current levels passing through the nodes. The MUX outputs a signal generated by combining the digital values.

As described above, a circuit and a method of testing a fail in a memory device of the present invention perform a fail test about the whole of the memory device by measuring a whole current of the memory device, and then perform a fail test about each of bit lines. Accordingly, the amount of the current consumed for performing the fail test about the whole of the memory device and performing the fail test about each of the bit lines may be reduced.

DESCRIPTION OF SPECIFIC EMBODIMENTS

Hereinafter, the embodiments of the present invention will be explained in more detail with reference to the accompanying drawings.

Figure 1:
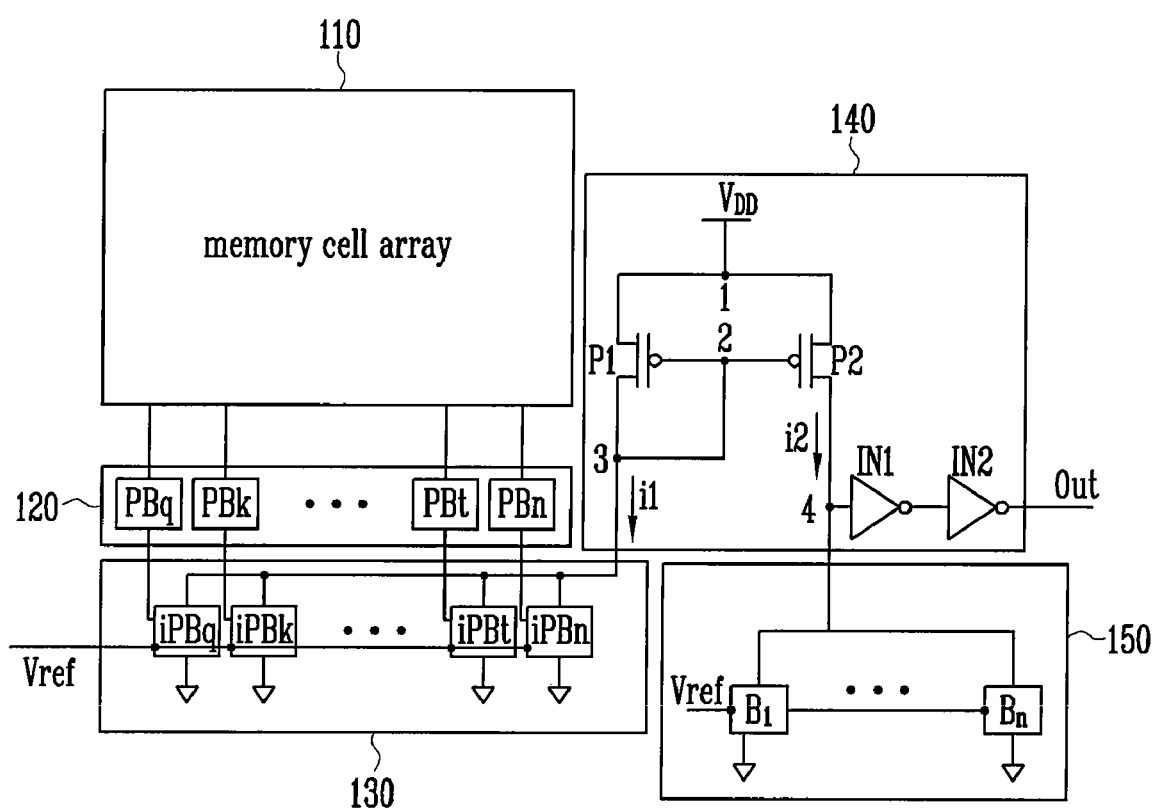
FIG. 1 is a plan view illustrating a common circuit for testing a fail.
Figure 2:
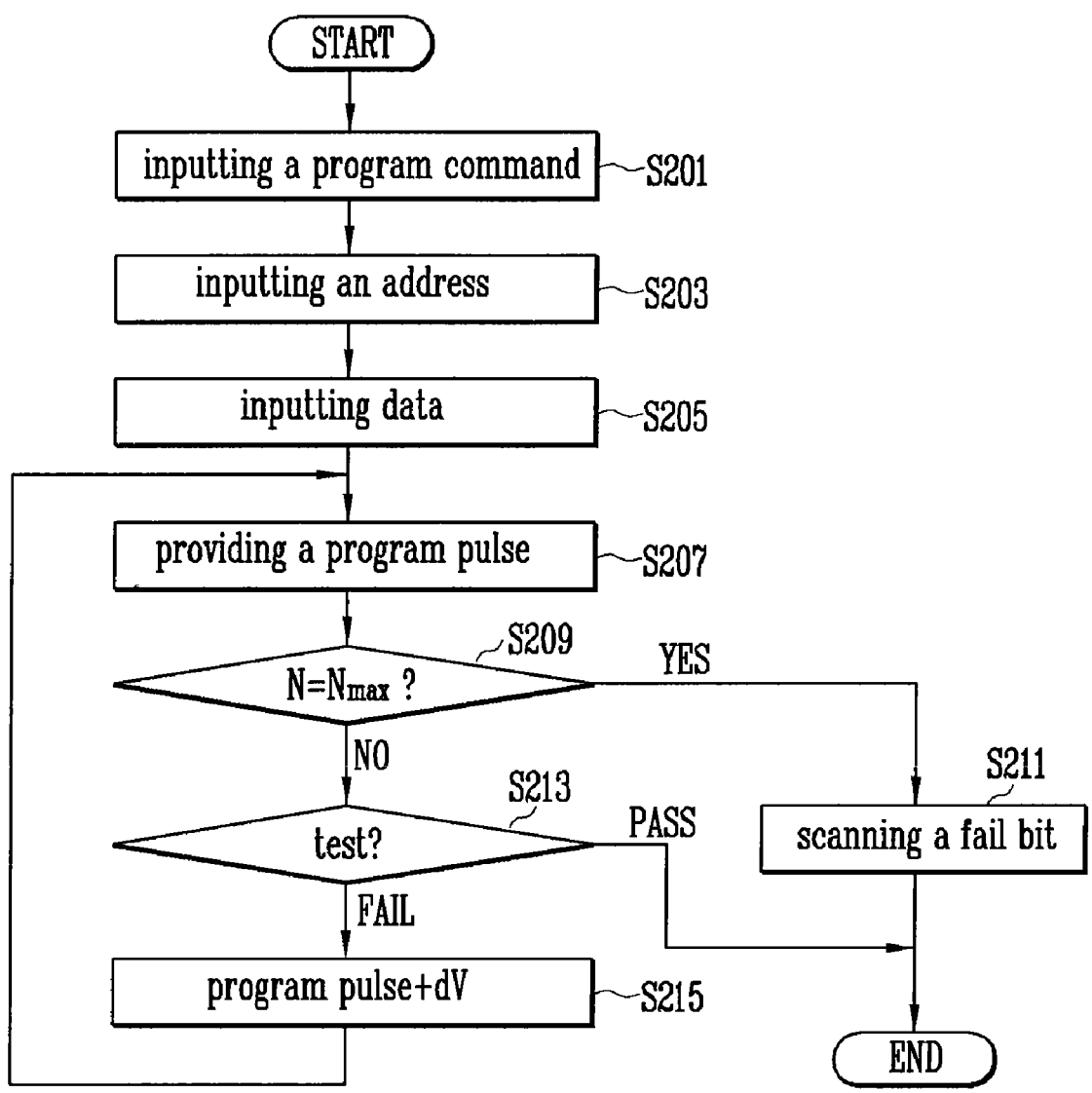
FIG. 2 is a flow chart illustrating a method of testing a fail of a bit line by using the circuit in FIG. 1.
Figure 3A:
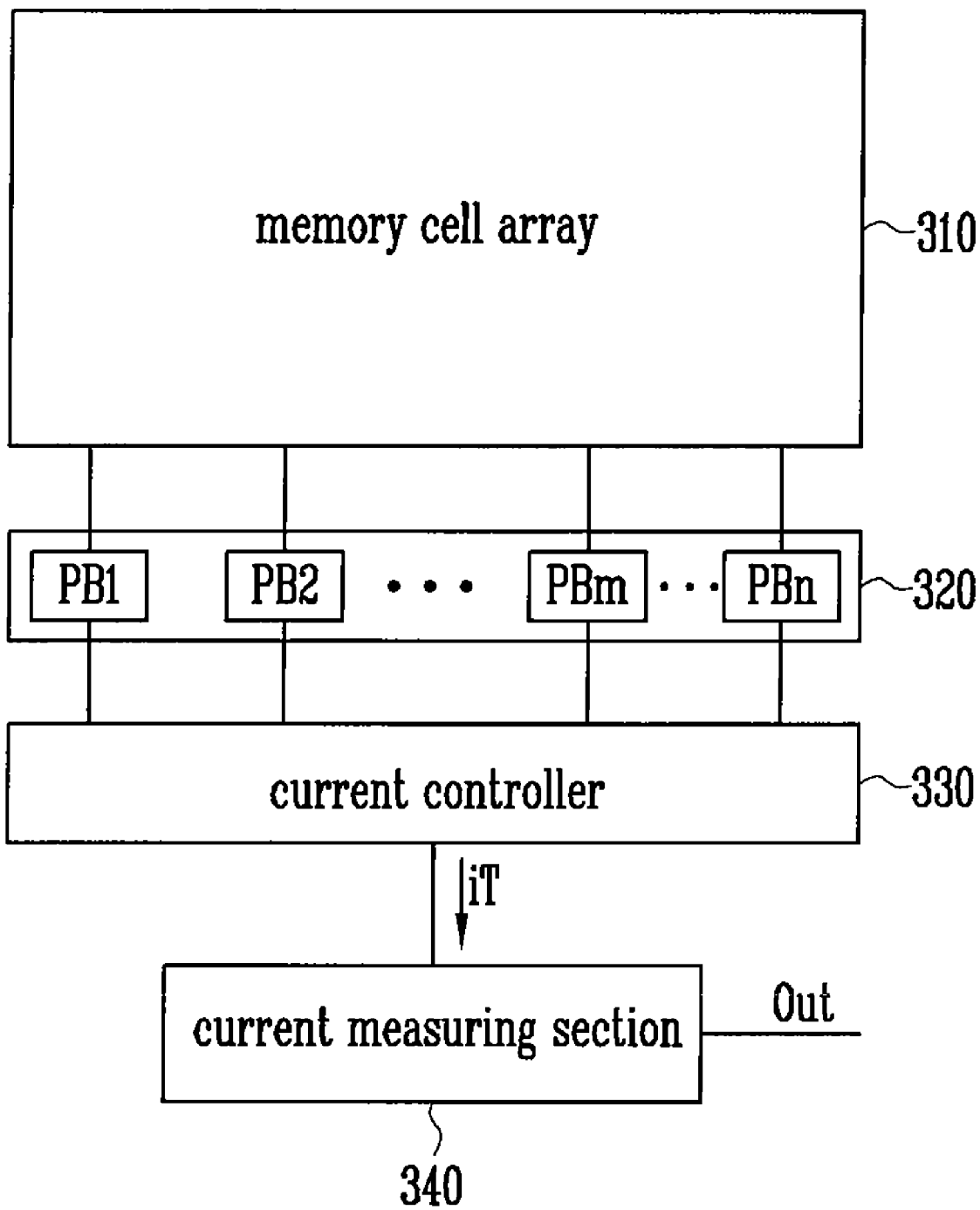
FIG. 3A is a block diagram illustrating a memory device according to an embodiment of the present invention.

In FIG. 3A, the memory device of the present embodiment includes a memory cell array 310 having at least one bit line which includes a plurality of memory cells for storing data, a page buffer section 320 having a plurality of page buffers PB1 to PBn for programming or reading data of the memory cell coupled to a pair of bit lines included in the memory cell array 310, a current controller 330 which is coupled to each of the page buffers PB1 to PBn and controls the current to be measured passing through the page buffers PB1 to PBn, and a current measuring section 340 for measuring a current passing through the current controller 330.

FIG. 3A show only a part of a circuit of the memory device, wherein the circuit tests a fail through the measure of the current.

The page buffers PB1 to PBn are coupled to a selected bit line. In this case, a certain current is passed through the page buffers PB1 to PBn.

The current controller 330 controls the output of each individual current passing through the page buffers PB1 to PBn or the output of the combined currents passing through all the page buffers PB1 to PBn.

The current measuring section 340 converts a value of a current iT outputted from the current controller 330 into a digital value, and outputs the digital value. Then, the current measuring section 340 verifies a number of bit lines to which a fail has occurred, or discriminates whether or not a fail has occurred to the whole of the memory device.

That is, in the case that the current passing through every page buffers PB1 to PBn is less than a given value, the current measuring section 340 discriminates that a fail has occurred to the memory device. Accordingly, the memory device does not need to scan individually a bit line to which a fail has occurred.

Figure 3B:
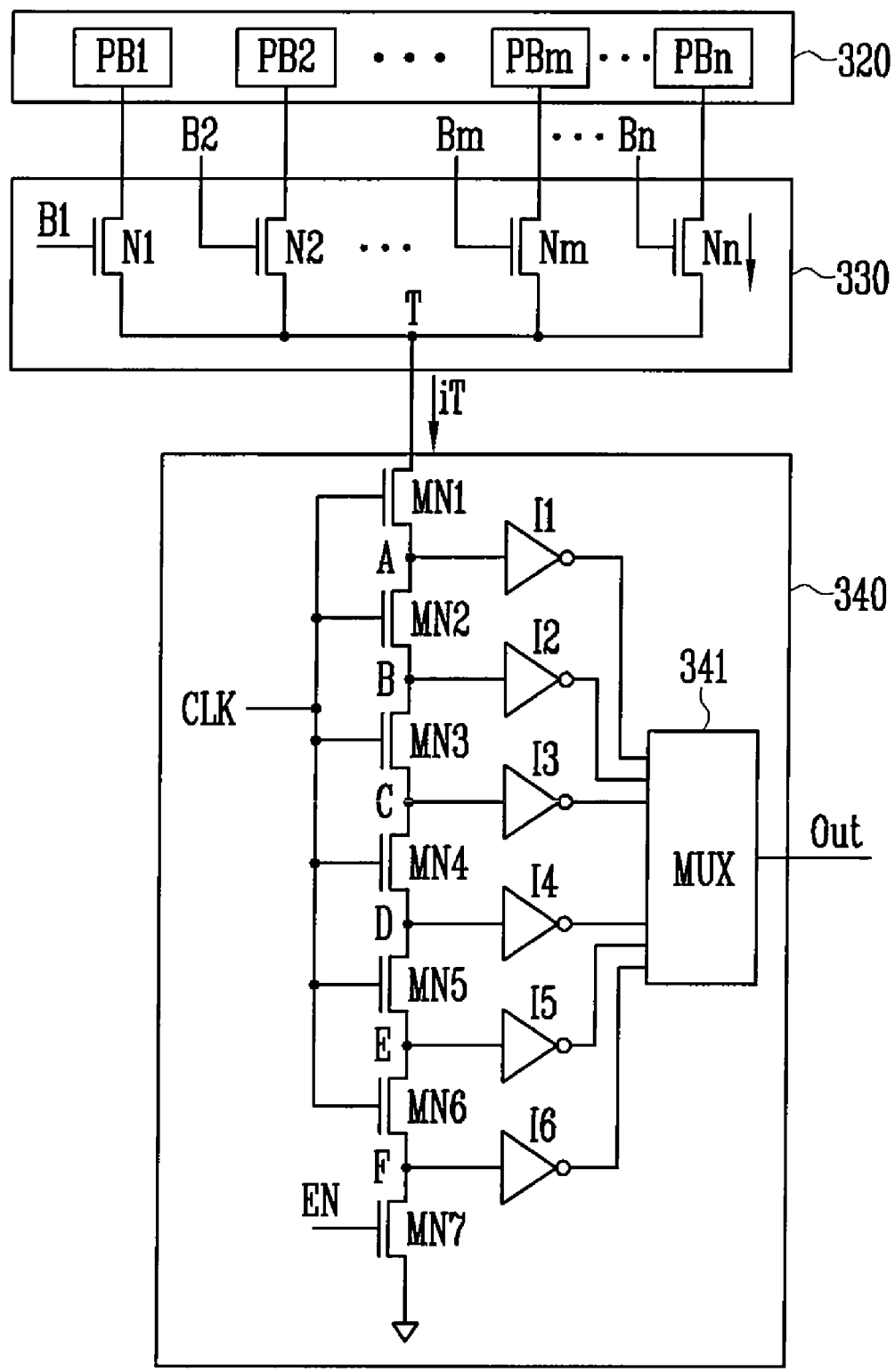
FIG. 3B is a view illustrating a circuit for testing a fail in FIG. 3A.

FIG. 3B is a view illustrating a circuit for testing a fail in FIG. 3A. Referring to FIG. 3B, the current controller 330 includes a first to nth N-MOS transistors N1 to Nn coupled between each of the page buffers PB1 to PBn in the page buffer section 320 and a node T. Here, the first to nth N-MOS transistors N1 to Nn are driven by control signals B1 to Bn, respectively.

In the case that the current passing through all page buffer PB1 to PBn is measured, the control signals B1 to Bn having a high level are provided to each N-MOS transistors N1 to Nn.

However, in the case that the current passing through one of the page buffers PB1 to PBn is measured, i.e. current passing through a desired bit line is measured, the control signal corresponding to the bit line of the control signals B1 to Bn is transmitted to the N-MOS transistor corresponding to the bit line of the N-MOS transistors N1 to Nn with a high level. Here, control signals having a low level are provided to the other N-MOS transistors. As a result, the current passing through only one bit line is outputted.

The current measuring section 340 includes a tenth to seventieth N-MOS transistors MN1 to MN7, a first to sixth inverters I1 to I6, and a multiplexer (hereinafter, referred to as "MUX") 341.

The tenth to seventieth N-MOS transistors MN1 to MN7 are coupled in series between the node T of the current controller 330 and a ground voltage.

A clock signal CLK is inputted to gates of the tenth to sixtieth N-MOS transistors MN1 to MN6. In addition, an enable signal EN is inputted to a gate of the seventieth N-MOS transistors MN7, and so the current measuring section 340 is operated.

The first to sixth inverters I1 to I6 are respectively coupled to nodes A to F between the tenth to seventieth N-MOS transistors MN1 to MN7. The inverters and N-MOS transistors convert an inputted analog current into digital values, and outputs the digital values.

Additionally, outputs of the first to sixth inverters I1 to I6 are inputted to the MUX 341. In this case, the MUX 341 combines the outputs of the first to sixth inverters I1 to I6, and outputs the combination result to verify a fail of a bit line or a fail of the whole of the memory device.

That is, when the current measuring section 340 is operated by the enable signal EN, the current iT outputted by the control signals B1 to Bn is inputted to the current measuring section 340. Further, in the case that the tenth to sixtieth N-MOS transistors MN1 to MN6 are turned on by the clock signal CLK, the nodes A to F have different current levels due to the resistance of the transistors MN1 to MN6, respectively.

The first to sixth inverters I1 to I6 convert the current levels (analog values) of the nodes A to F into digital values, and output the digital values.

The MUX 341 outputs in sequence the digital values provided from the first to sixth inverters I1 to I6, or output a signal generated by combining the digital values through a given combination method of the MUX 341.

The output of the MUX 341 is provided to a pad of the memory device so that a user may verify a fail of the memory device or count the number of bit lines to which a fail has occurred.

Hereinafter, the method of testing a fail using the above circuit of the present invention will be described in detail.

Figure 4:
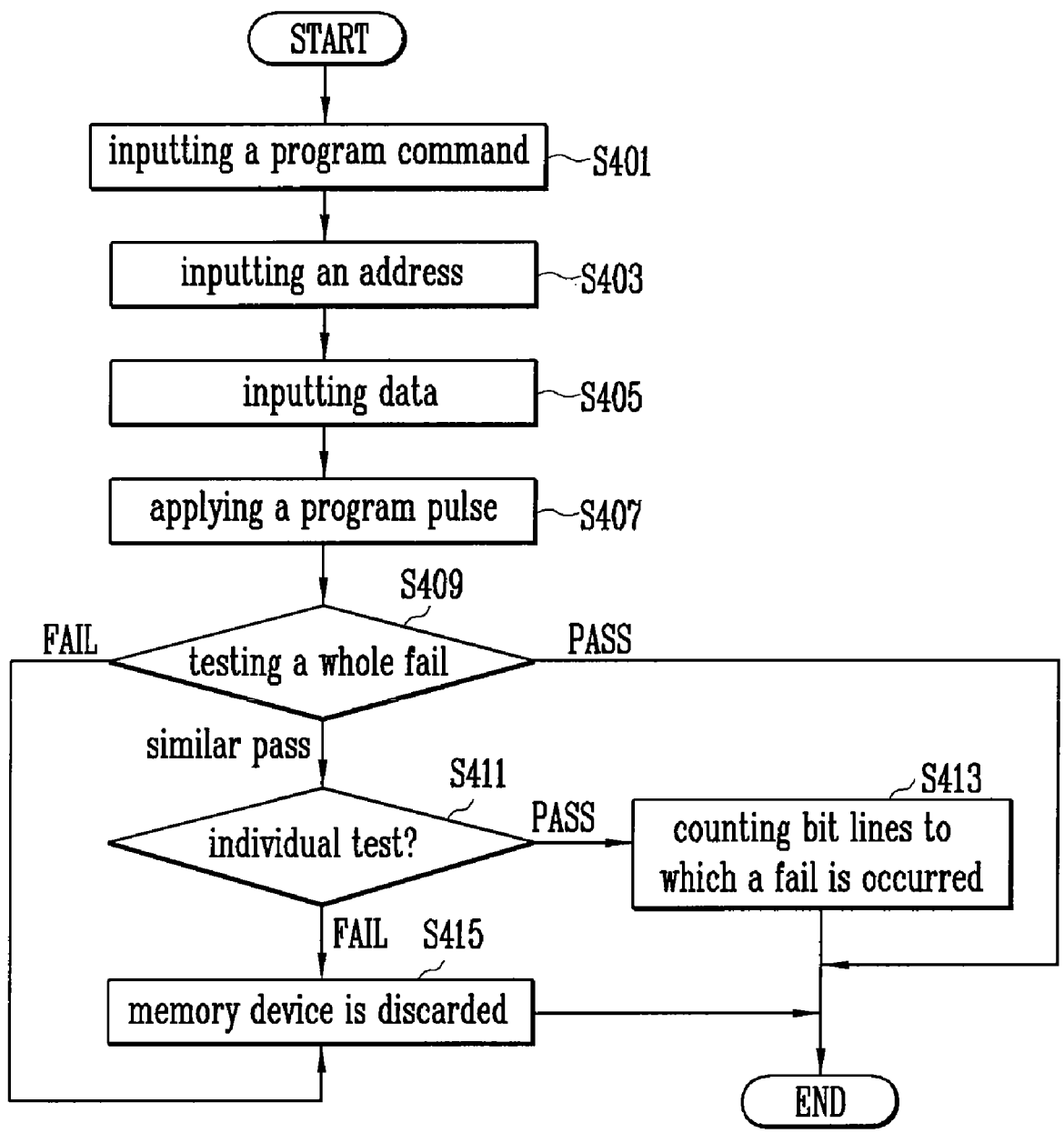
FIG. 4 is a flow chart illustrating a method of testing a fail in a memory device according to an embodiment of the present invention.

FIG. 4 is a flow chart illustrating a method of testing a fail in a memory device according to an embodiment of the present invention.

In FIG. 4, to test the fail in the memory device, a program command is inputted in step of S401, and then an address of a memory cell for a program operation and data to be programmed are inputted to the memory device in steps of S403 and S405. Subsequently, a program pulse is applied so that the data are programmed in step of S407.

The control signals B1 to Bn having a high level are transmitted to the N-MOS transistors N1 to Nn so as to test whether or not the memory device is operating normally. As a result, the currents of every page buffers PB1 to PBn are passed to the node T of the current controller 330.

In step of S409 (Coast Verify), the current iT passing through the node T is outputted by the current measuring section 340. In this case, the user verifies through the outputted current iT whether or not a fail has occurred to the memory device.

In other words, the combined currents passing through every bit line is measured. In this case, when the value of the currents is less than a given minimum current value, the user discriminates that a fail has occurred to some of the bit lines in the memory device. Here, the number of bit lines to which a fail has occurred is more than a predetermined number.

For example, in the case that the memory device has n bit lines, the current passing through every bit lines is assumed as iP when the memory device is in a normal state, and the current passing through every bit line is assumed as ipk when a fail has occurred to k bit lines.

In the case that the current measured in step of S409 is less than the ipk, it is discriminated that a fail has occurred to p (integer higher than k) bit lines though the user does not know how many bit lines a fail has occurred to. Hence, the memory device does not need to perform a fail test for each individual bit line. In this case, the memory device is regarded as a defective device in step of S415, and so the memory device is discarded.

However, in the case that the current measured in step of S409 has a value between the ipk and the iP, the memory device may be used, but a process of testing individually the bit lines is performed because the number of the bit lines to which a fail has occurred is smaller than k in step of S411 (Fine Verify).

In the process of testing individually the bit lines, the control signals B1 to Bn having a high level are provided in sequence to the transistors N1 to Nn. Subsequently, the current measuring section 340 measures in sequence the currents passing through each of the bit lines, verifies through the measured currents whether or not a fail has occurred to the bit lines, and counts the number of bit lines to which a fail has occurred in step of S413. Here, in the case that the number of the bit lines to which a fail has occurred is more than a predetermined number, the memory device is discarded in step of S415.

In brief, in the case that a fail has occurred to p (integer higher than k) bit lines, the process of testing individually the bit lines is not performed. Accordingly, a time required for performing the fail test is reduced, and the memory device may be discarded. In addition, in the case that the memory device may be used through the above test process, the process of testing individually the bit lines is performed, e.g. the number of the bit lines to which a fail has occurred is counted. Hence, a time required for testing the fail may be reduced.

Further, the process of testing the fail does not need to use extra reference voltage, and so the fail test about the whole of the memory device and the fail test about each of the bit lines may be performed with low current.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for testing a fail in a memory device, the circuit comprising:
   a current controller having a plurality of switching sections, wherein each of the switching sections is coupled between one of a plurality of page buffers for programming or reading data in a memory cell and a first node to provide a current path between the corresponding page buffer and the first node, wherein the page buffers corresponding to the switching sections are selected from the plurality of page buffers in response to control signals; and
   a current measuring circuit configured to convert a current of each current path into a digital value, and to output the digital values.

2. The circuit of claim 1, wherein each switching section includes a first transistor coupled between the corresponding page buffer and the first node, and
   wherein the first transistors are operated in accordance with the control signals.

3. The circuit of claim 2, wherein the current measuring circuit includes:
   a plurality of second transistors coupled in series between the first node and a ground voltage, wherein one or more of the second transistors are operated according to a clock signal;
   a plurality of inverters coupled to nodes between the second transistors, wherein each inverter is configured to convert a level of a current flowing through the corresponding node into a digital value and output the digital value; and
   a multiplexer configured to output a signal derived by combining the digital values output from the inverters.

4. The circuit of claim 3, wherein the second transistors coupled to the ground voltage are controlled with an enable signal, the second transistors controlling an operation of the current measuring circuit.

5. The circuit of claim 1, wherein the control signals have high levels when a fail test is performed on the entire memory device.

6. A method of testing a fail in a memory device having a memory cell array which includes memory cells coupled to pairs of bit lines and word lines, and page buffers corresponding to each of the pairs of the bit lines, the method comprising:
   performing a program operation or a read operation on the memory cell array;
   performing a fail test to determine whether or not a fail has occurred on the memory device by measuring a total current passing through all page buffers;
   measuring currents passing through all page buffers if it is verified that a fail has not occurred to the entire memory device, and performing a fail test on each bit line coupled to the page buffers; and
   counting a number of the bit lines that have experienced a failure in accordance with the fail test.

7. The method of claim 6, wherein performing the fail test includes:
   regarding the memory device as a failed device if a level of the total current is less than a level of the first current;
   regarding the memory device as an imaginary failed device if the level of the total current has a value between the first current level and a second current level; and
   performing a fail test on each of the bit lines.

8. The method of claim 7, wherein the first current level is a current level set for verifying the fail.

9. The method of claim 7, wherein the second current level corresponds to a total current level when no fail has occurred to the memory device.

10. The method of claim 7, wherein it is determined that the fail has occurred to the memory device if a number of the bit lines to which the fail has occurred is more than a given value, and
    wherein the number of the bit lines is obtained in the step of performing the fail test about each of the bit lines in the imaginary failed memory device.

11. A memory device comprising:
    a memory cell array having memory cells coupled to pairs of bit lines and word lines;
    a page buffer section having page buffers for programming data to a selected memory cell or reading data from the memory cell;
    a current controller having a plurality of switching sections, wherein each of the switching sections is coupled between a first node and one of the page buffers in the page buffer section to provide a current path between the corresponding page buffer and the first node, wherein the page buffer corresponding to each switching section is selected from the page buffer section in response to control signals; and
    a current measuring circuit configured to convert a current of each current path into a digital value, and to output the digital value.

12. The memory device of claim 11, wherein each of the switching sections includes a first transistor coupled between to the corresponding page buffer and the first node, and
    wherein the first transistors are operated by the control signals.

13. The memory device of claim 12, wherein the current measuring circuit includes:
- a plurality of second transistors coupled in series between the first node and a ground voltage, wherein some of the second transistors are operated using a clock signal;
- a plurality of inverters coupled to nodes between the second transistors, wherein the inverters are configured to output digital values corresponding to current levels passing through the nodes; and
- a multiplexer configured to output a signal generated by combining the digital values output by the inverters.

* * * * *